United States Patent
Qiu et al.

(10) Patent No.: US 8,692,387 B2
(45) Date of Patent: Apr. 8, 2014

(54) STACKED DIE SEMICONDUCTOR PACKAGE

(75) Inventors: Shunan Qiu, Tianjin (CN); Guoliang Gong, Tianjin (CN); Xuesong Xu, Tianjin (CN); Xingshou Pang, Tianjin (CN); Beiyue Yan, Tianjin (CN); Yinghui Li, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/490,451

(22) Filed: Jun. 6, 2012

(65) Prior Publication Data

US 2013/0020690 A1    Jan. 24, 2013

(30) Foreign Application Priority Data

Jul. 22, 2011  (CN) .......................... 2011 1 0205715

(51) Int. Cl.
*H01L 23/31*   (2006.01)

(52) U.S. Cl.
CPC ............. *H01L 23/3135* (2013.01); *H01L 23/31* (2013.01)
USPC .... 257/777; 257/676; 257/686; 257/E23.033; 257/E23.052; 257/E21.502; 438/124

(58) Field of Classification Search
CPC . H01L 23/31; H01L 23/3135; H01L 23/3171; H01L 23/3185
USPC .......... 257/676, 686, 777, E23.033, E23.052; 438/123, 124
See application file for complete search history.

(56) References Cited

U.S. PATENT DOCUMENTS

| | | | |
|---|---|---|---|
| 7,211,466 B2 | 5/2007 | Lo | |
| 7,378,298 B2 | 5/2008 | Lo | |
| 7,598,606 B2 | 10/2009 | Chow | |
| 7,671,459 B2 * | 3/2010 | Corisis et al. | 257/686 |
| 7,718,471 B1 | 5/2010 | Zaccardi | |
| 7,955,953 B2 | 6/2011 | Lo | |
| 8,072,770 B2 * | 12/2011 | Kummerl et al. | 361/772 |
| 2002/0074638 A1 * | 6/2002 | Liao et al. | 257/686 |
| 2004/0178490 A1 * | 9/2004 | Abe et al. | 257/686 |
| 2006/0208363 A1 * | 9/2006 | Shiu et al. | 257/777 |
| 2008/0099784 A1 * | 5/2008 | Lo et al. | 257/186 |
| 2008/0122113 A1 * | 5/2008 | Corisis et al. | 257/777 |
| 2008/0157324 A1 * | 7/2008 | Tang et al. | 257/686 |
| 2009/0091008 A1 * | 4/2009 | Mizukami | 257/666 |
| 2010/0091472 A1 * | 4/2010 | Kummerl et al. | 361/772 |

* cited by examiner

*Primary Examiner* — Allan R Wilson
(74) *Attorney, Agent, or Firm* — Charles Bergere (57) ABSTRACT

A semiconductor package and method of assembling a semiconductor package includes encapsulating a first pre-packaged semiconductor die stacked on top of and interconnected with a second semiconductor die. The first packaged semiconductor die is positioned and fixed relative to a lead frame with a temporary carrier such as tape. The second semiconductor die is attached and interconnected directly to the first packaged semiconductor die and lead frame. The interconnected first packaged die and second semiconductor die, and lead frame are encapsulated to form the semiconductor package. Different types of semiconductor packages such as quad flat no-lead (QFN) and ball grid array (BGA) may be formed, which provide increased input/output (I/O) count and functionality.

10 Claims, 8 Drawing Sheets

STACKED DIE SEMICONDUCTOR PACKAGE

BACKGROUND OF THE INVENTION

The present invention relates generally to semiconductor device packaging, and more particularly to a stacked die semiconductor package.

Semiconductor packages are containers for integrated circuits and devices. The semiconductor package includes an encapsulated semiconductor die with the integrated circuits and devices. The semiconductor package has exposed input/output (I/O) leads used to interconnect the semiconductor die with external circuitry when for example the semiconductor package is mounted to a printed circuit board (PCB). The die may be packaged in a number of different carrier or package configurations, for example, quad flat no-lead (QFN), ball grid array (BGA), and the like. Such semiconductor packages protect the die and the interconnections to the die and allow for the various types of external I/Os.

There is a continual demand for semiconductor packages with increased speed and functionality with smaller package footprints and thicknesses. In an attempt to increase functionality, some semiconductor packages include more than one semiconductor die. For example, some semiconductor packages include two or more dies stacked one atop another. Other stacked die packages include a die stacked on an already packaged (encapsulated) die. However, such die stacked on packaged die semiconductor packages are limited to certain types of semiconductor packages, and the number of I/O leads exposed on the semiconductor package is limited. Additionally, the interconnection between the die and the packaged die of such die stacked on packaged die semiconductor packages is made external to the semiconductor package in the external circuitry. This adds to additional design considerations, processing steps, and increased costs in mounting the semiconductor package with the external circuitry. Moreover, the higher powered devices generate higher thermal energy that mainly diffuses via the die carrier, however, current BGA stacked-die packages are thermally limited and designed to apply in lower power devices and applications. There is a need for addressing or at least alleviating some of the above problems.

BRIEF DESCRIPTION OF THE DRAWINGS

The accompanying drawings incorporated herein and forming a part of the specification illustrate several aspects of the present invention and, together with the description, serve to explain the principles of the invention. While the invention will be described in connection with certain embodiments, there is no intent to limit the invention to those embodiments described. On the contrary, the intent is to cover all alternatives, modifications and equivalents as included within the scope of the invention as defined by the appended claims. In the drawings:

DETAILED DESCRIPTION

An aspect of the invention is a packaged semiconductor device comprising a first packaged semiconductor die having a first lead frame having first leads exposed from the packaged semiconductor die, the first packaged semiconductor die having a first surface; a second semiconductor die affixed to the first surface of the first packaged semiconductor die; a second lead frame for providing an input and output to the packaged semiconductor device to external circuitry with the first packaged semiconductor die and the second semiconductor die; a first connector to interconnect the first die with the second die; a second connector to interconnect the first die to the second lead frame; and an encapsulating material to cover the first packaged semiconductor die, second semiconductor die, the first connector, the second connector, the first lead frame and the second lead frame.

In an embodiment, a portion of the second lead frame is exposed. A portion of the first lead frame may be exposed. A portion of the first lead frame may be extruded from the first packaged semiconductor die. A portion of the second lead frame may be offset on another plane from another portion of the lead frame. The offset portion of the second lead frame may be the lead of the second lead frame and is encapsulated by the encapsulating material. The first packaged semiconductor die may be a quad flat no-lead (QFN) type packaged device. The first packaged semiconductor die may be a power quad flat no-lead (PQFN) type packaged device. The packaged semiconductor device may be a quad flat no-lead (QFN) type packaged device. The packaged semiconductor device may be a ball grid array (BGA) type packaged device.

An aspect of the invention is a method of packaging a packaged semiconductor comprising affixing to a carrier a first packaged semiconductor die and a second lead frame, the first packaged semiconductor die having a first lead frame having first leads exposed from the packaged semiconductor die, the first packaged semiconductor die having a first surface; fixing a second semiconductor die to the first surface of the first packaged semiconductor die, the second lead frame for providing an input and output to the packaged semiconductor device to external circuitry with the first packaged semiconductor die and the second semiconductor die; interconnecting a first connector to interconnect the first die to the second die; interconnecting a second connector to interconnect the first die to the second lead frame; encapsulating with an encapsulating material to cover the first packaged semiconductor die, second semiconductor die, the first connector, the second connector, the first lead frame and the second lead frame; and removing the carrier to form packaged semiconductor.

In an embodiment, the carrier is tape. A portion of the first lead frame may be exposed and a portion of the second lead frame may be exposed. A portion of the first lead frame may be extruded from the first packaged semiconductor die. The first packaged semiconductor die may be a quad flat no-lead (QFN) type packaged device. The first packaged semiconductor die may be a power quad flat no-lead (PQFN) type packaged device. The packaged semiconductor device may be a quad flat no-lead (QFN) type packaged device. The packaged semiconductor device may be a ball grid array (BGA) type packaged device. The interconnecting may be by wire bonding. Solder balls may be formed on a surface of the second lead frame.

A semiconductor package and method of packaging such a semiconductor package is disclosed encapsulating a first pre-packaged semiconductor die stacked on top of and interconnected with a second semiconductor die. The first pre-packaged semiconductor die is positioned and fixed relative to a padless lead frame with a temporary carrier such as tape. The second semiconductor die is attached and interconnected directly to a first surface such as the top surface of the first packaged semiconductor die and lead frame. The interconnected first packaged semiconductor die and second semiconductor die, and lead frame are encapsulated forming the semiconductor package with interconnected stacked die and packaged die. With such an arrangement and method, different types of semiconductor packages such as quad flat no-lead (QFN) type packages, ball grid array (BGA) type packages may be formed from stacked die and packaged die type devices increasing input/output (I/O) count and functionality and applications of the semiconductor package.

FIGS. 1-11 show different stages in the assembly or packaging process for making a semiconductor package with interconnected stacked die and packaged die in accordance with an embodiment of the invention.

Figure 1:
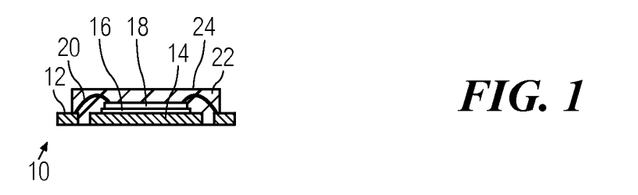
FIG. 1 is a simplified cross-sectional view of a first packaged semiconductor die in accordance with an embodiment of the invention.

Referring now to FIG. 1, a simplified cross-sectional view of a first packaged semiconductor die 10 in accordance with an embodiment of the invention is shown. In this embodiment the packaged semiconductor die 10 is a quad flat no-lead (QFN) type semiconductor package. It will be appreciated that the packaged semiconductor may be different types of packages such as: quad flat no-lead (QFN), power quad flat no-lead (PQFN), small outline integrated circuit (SOIC), quad flat package (QFP) and other leaded packages. These packages have extruded leads to provide interconnection with other circuitry such as a second die. The first packaged semiconductor die 10 comprises a first lead frame 12 and lead frame die support or paddle 14 for supporting a semiconductor die 18 bonded to the paddle 14 with an adhesive or die bond material 16. The semiconductor die 18 is fixed with die bond material 16 or a die attach layer to the paddle 14. The semiconductor die 18 is wire bonded with wires 20 to the leads of the lead frame 12. Encapsulant material 22, such as a plastic or the like, covers and protects the semiconductor die 18, wires 20, lead frame 12, and the like. The encapsulant material 22 forms a top surface 24 of the first packaged semiconductor die 10. The leads of the first lead frame 12 extend from the first packaged semiconductor 10. A semiconductor package type with extruded or exposed leads is the punch type QFN as opposed to singulation type QFN. As the packaged semiconductor in an embodiment may have a die support or paddle, this embodiment utilizes the high thermal conductivity of copper or other metal or metal alloy, which provides excellent thermal conductivity for high power devices.

Figure 2:
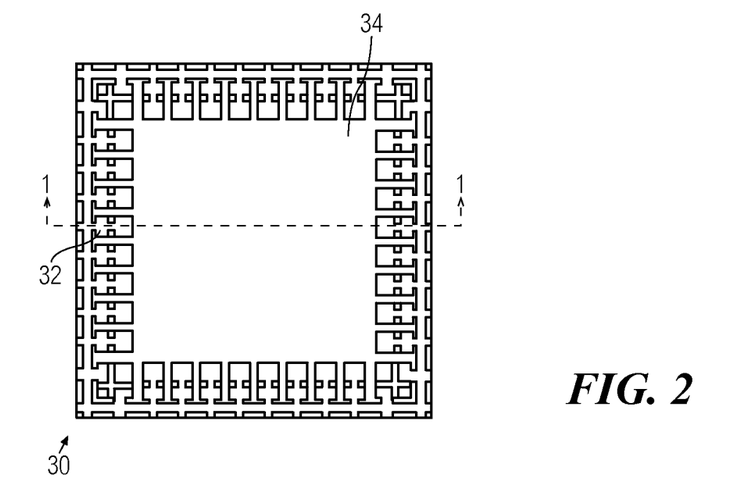
FIG. 2 is a top plan view of a lead frame attached to tape in accordance with an embodiment of the invention.
Figure 3:
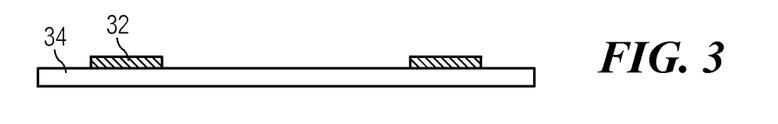
FIG. 3 is a cross-sectional view taken from the dashed line 1-1 of FIG. 2 of a lead frame attached to tape in accordance with an embodiment of the invention.

FIG. 2 shows a top plan view of a second lead frame 30 with leads 32 attached to a temporary carrier such as a tape 34 in accordance with an embodiment of the invention. For illustrative purposes, the second lead frame 30 may be any material widely used in the industry such as a copper alloy or the like. FIG. 3 is a cross-sectional view taken from the dashed line 1-1 of the lead frame 30 of FIG. 2 attached to the tape 34 in accordance with an embodiment of the invention. The carrier or tape 34 may take different forms other than tape. For example, the carrier may be a tape having a base film with a highly sticky adhesive material. It will be appreciated that the tape 34 can resist high temperature such as 250° C. The lead frame 30 in this embodiment is a paddleless type lead frame having a square configuration. It will be appreciated that the lead frame may have different shapes and lead configurations and arrangements.

Figure 4:
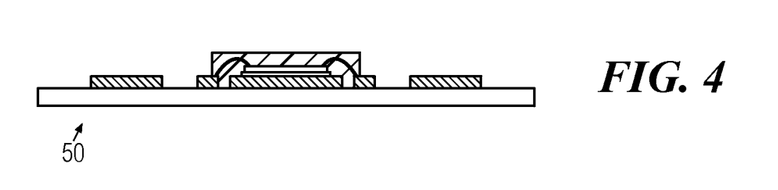
FIG. 4 is a cross-sectional view of the first packaged semiconductor die of FIG. 1 attached to the tape of FIG. 2 and FIG. 3 in accordance with an embodiment of the invention.

FIG. 4 is a cross-sectional view 50 of the first packaged semiconductor die 10 of FIG. 1 attached to a carrier, such as the tape 34 of FIGS. 2 and 3 in accordance with an embodiment of the invention. The packaged semiconductor die 10 is placed on the tape in a middle area formed by the lead frame leads. It will be appreciated that the lead frame and packaged die may have different shapes and configurations and may be placed in different orientations such as the lead frame leads may extend fully (as shown) or partially around the perimeter of the packaged semiconductor die 10 after the packaged semiconductor die 10 is placed on the tape. The examples shown and discussed here are just provided for illustrative purposes. The first packaged semiconductor die 10 is firmly attached on the tape 34 to prevent molding material 78 from bleeding under the die paddle 14 or lead frame leads 12.

Figure 5:
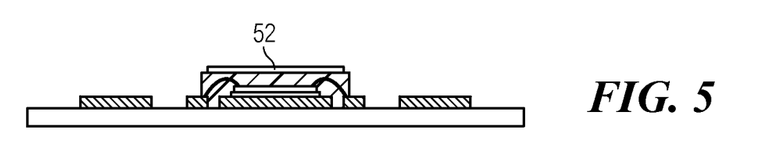
FIG. 5 is a cross-sectional view of a die attach applied to the top of the first packaged semiconductor die of FIG. 4 in accordance with an embodiment of the invention.
Figure 6:
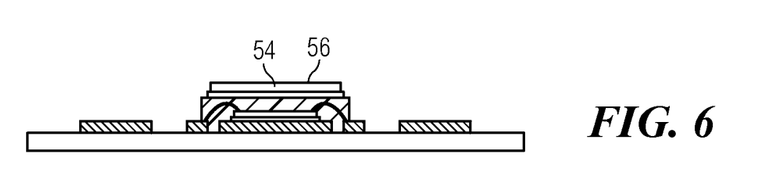
FIG. 6 is a cross-sectional view of a second die fixed to the die attach to the top of the first packaged semiconductor die of FIG. 5 in accordance with an embodiment of the invention.

FIGS. 5 and 6 show a cross-sectional view of a die attach material 52 and chip or semiconductor die 54 applied to the top of the first packaged semiconductor die 10 of FIG. 4 in accordance with an embodiment of the invention. The semiconductor die 54 has a top surface 56. In this embodiment, the semiconductor die 54 has a dimension smaller than the top surface of the first packaged semiconductor die 10.

Figure 7:
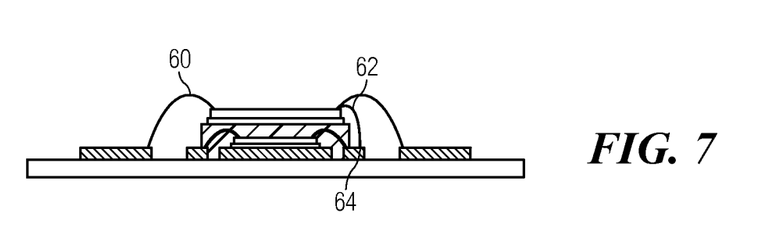
FIG. 7 is a cross-sectional view wire bonds attached to the second die to the lead frame of FIG. 6 in accordance with an embodiment of the invention.
Figure 8:
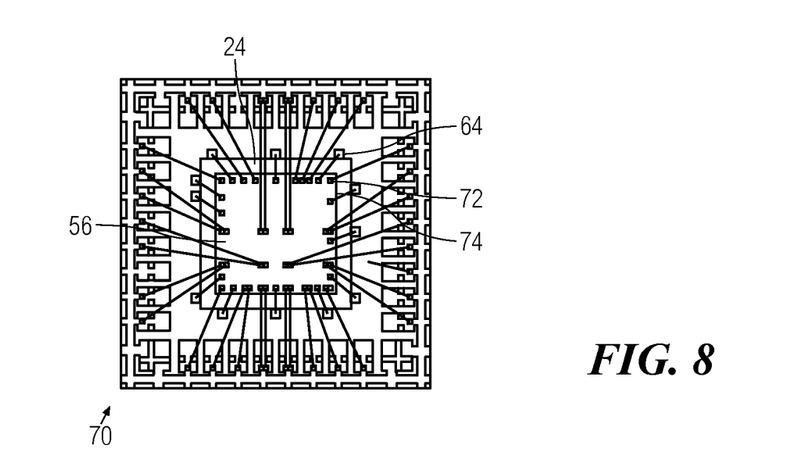
FIG. 8 shows a top plan view of the wire bonds attached to the second die to the lead frame of FIG. 7 in accordance with an embodiment of the invention.

FIG. 7 is a cross-sectional view wire bonds with wires 60 attached to the lead frame leads 32 and wires 62 attached to the extending or extruded leads 64 of the first packaged semiconductor die 10. At the point of connection between the extending leads 64 and the wires 62 connection is made. The material of the wires may be any material typically used in the industry such as gold (Au), copper (Cu), or the like. The wires are bonded from the top side 56 of the die 54 from wire bond pads (not shown) to the extruded leads 64 of the first die package. FIG. 8 shows a top plan view 70 of the wire bonds attached to the second die to the lead frame of FIG. 7 in accordance with an embodiment of the invention. The wires 62 interconnect the second die 52 attached to wire bond pads 72 from the top of the first packaged die 10 via the extruded leads 64, and the wires 60 interconnect the second die 52 from wire bond pads 74 from the top of the first packaged die 10 to the extruded portion 64 of the leads 12 of the first lead frame forming the input/output (I/O) of the packaged semiconductor for electrical interconnection with external circuitry (not shown) once placed on for example a printed circuit board (PCB). The wires 60,62 may be wirebonded in any order or simultaneously in a single processing step.

Figure 9:
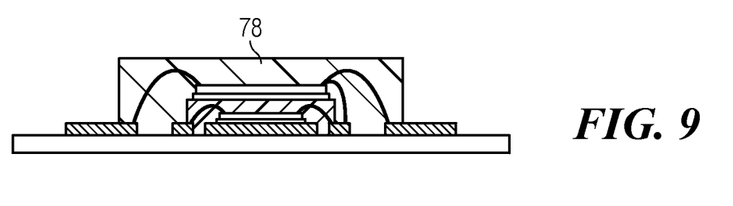
FIG. 9 is a cross-sectional view of mold material encapsulating the wire bonds, second die, lead frame, and first packaged semiconductor of FIG. 7 and FIG. 8 in accordance with an embodiment of the invention.

FIG. 9 is a cross-sectional view of second mold material 78 encapsulating the wire bonds 60, 62, second die 54, wire bond pads, lead frame 30, and first packaged semiconductor 10 of FIG. 7 and FIG. 8 in accordance with an embodiment of the invention. The encapsulant overmold material 78, liquid glob-top or the like is transfer molded or the like to completely encapsulate and protect the fragile components of the semiconductor package. The mold material forms a protective cover to protect the components from external and ambient conditions such as moisture, strain, shock, vibration, dust, and the like. The mold material may be an epoxy resin, plastic, or the like, and is chosen to meet the specification requirements of a particular application. The second mold or encapsulant material 78 of the packaged semiconductor device may be the same or different material of the first mold or encapsulant material 22 of the first packaged semiconductor device.

Figure 10:
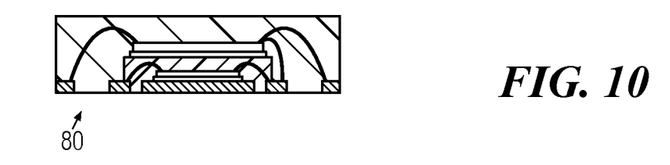
FIG. 10 shows a packaged semiconductor device with first packaged semiconductor interconnected and encapsulated with a second die with exposed connectors in a quad flat no-lead (QFN) type packaged semiconductor device in accordance with an embodiment of the invention.
Figure 11:
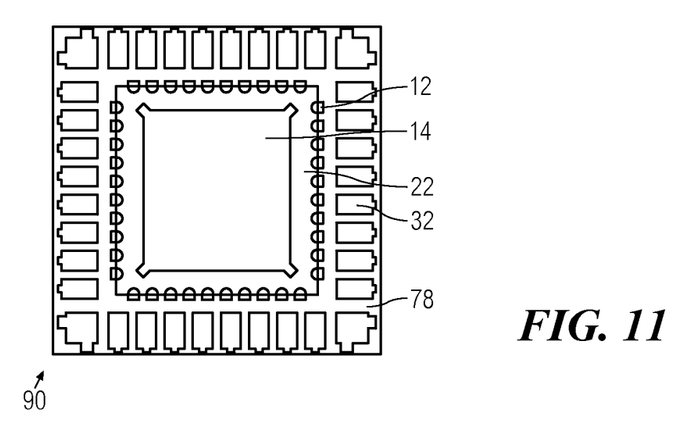
FIG. 11 shows a bottom plan view of the packaged semiconductor device of FIG. 10 in accordance with an embodiment of the invention.

FIGS. 10 and 11 show a packaged semiconductor device with a first packaged semiconductor interconnected and encapsulated with a second die in accordance with an embodiment of the invention. FIG. 10 is a cross-sectional view 80 and FIG. 11 is a bottom plan view 90 of the packaged semiconductor device. The packaged semiconductor device is shown after the tape 34 is removed and the packaged semiconductor device is sawn.

Figure 12:
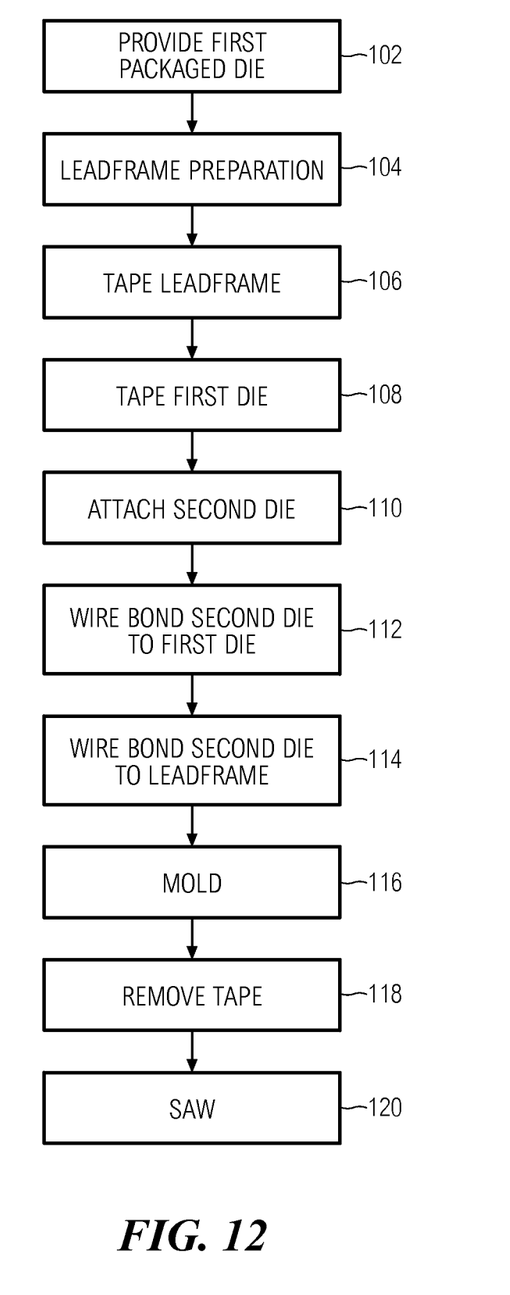
FIG. 12 is a flow chart showing a method of packaging a packaged semiconductor device in accordance with an embodiment of the invention.

FIG. 12 is a flow chart showing a method 100 of packaging a packaged semiconductor device in accordance with an embodiment of the invention. The method comprises preparing 102,104 the first packaged semiconductor die 10 and the lead frame. Taping 106,108 the lead frame 12 and the first packaged semiconductor die 10 to the tape. It will be appreciated that the taping of the lead frame and the first packaged semiconductor die may be in any order or simultaneously in a single processing step. Attaching 110 the second die 54 to the top surface of the first packaged semiconductor die 10. Wire bonding 112 the second die 54 to the first die via the extruded leads 64 of the lead frame of the first packaged semiconductor die 10, and wire bonding the second die 54 to the lead frame leads 32. It will be appreciated that the wires 60, 62 may be wirebonded in any order or simultaneously in a single processing step. Encapsulating or molding 116 the components of the packaged semiconductor including the interconnected second die 54 and the first packaged semiconductor die 10, wire bonds 60, 62, lead frame 32, and extruded leads 64. Removing 118 the tape and sawing 120 the components if multiple packaged semiconductors dies are being processed as shown in FIGS. 10 and 11. External interconnects or input/output (I/O) connectors such as ball grid array (BGA) may be processed for interconnecting the processed semiconductor to external circuitry (not shown).

FIGS. 13-19 show the different stages of the packaging of a semiconductor package with interconnected stacked die and packaged die in accordance with an embodiment of the invention.

Figure 13:
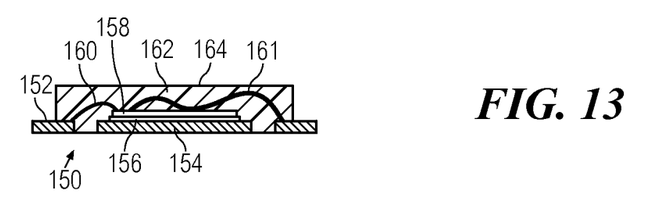
FIG. 13 is a simplified cross-sectional view of a first packaged semiconductor die in accordance with an embodiment of the invention.

FIG. 13 is a simplified cross-sectional view of a first packaged semiconductor die 150 in accordance with an embodiment of the invention. The first packaged semiconductor die 150 is similar to the first packaged semiconductor die 10 discussed with reference to FIG. 1 to FIG. 12, however the packaged semiconductor die 150 shown in FIG. 13 is a pouch power quad flat no-lead (PQFN) type packaged semiconductor device comprising a lead frame 152 with lead, lead frame die support 154, a layer of die bond material 156, a chip or die 158, wires 160 to interconnect the die with the leads of the lead frame, aluminium (Al) wire 161 to connect PQFN power die and power lead by crossing the die top, and the protective first encapsulant mold material 162.

Figure 14:
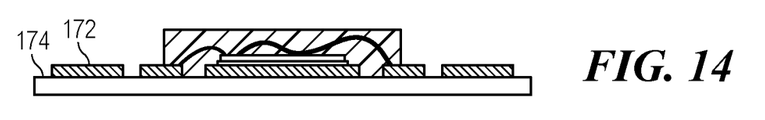
FIG. 14 is a cross-sectional view of the first packaged semiconductor die of FIG. 13 and a lead frame attached to tape in accordance with an embodiment of the invention.

FIG. 14 is a cross-sectional view of the first packaged semiconductor die 150 of FIG. 13 and a lead frame 172 attached to tape 174 in accordance with an embodiment of the invention. The lead frame and tape may be similar to the lead frame discussed with reference FIG. 2 and FIG. 3.

Figure 15:
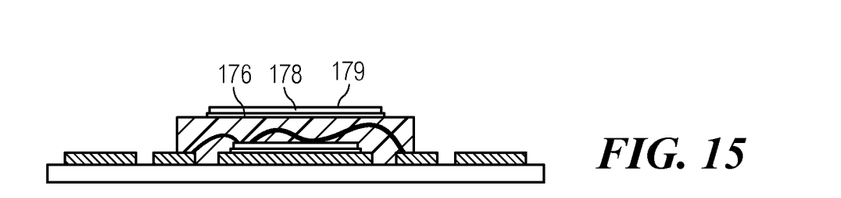
FIG. 15 is a cross-sectional view of a second die attached to the top of the first packaged semiconductor die of FIG. 14 in accordance with an embodiment of the invention.

FIG. 15 is a cross-sectional view of a layer of die bond material 176 to attach a second die 178 to the top surface 179 of the first packaged semiconductor die 150 of FIG. 14 in accordance with an embodiment of the invention.

Figure 16:
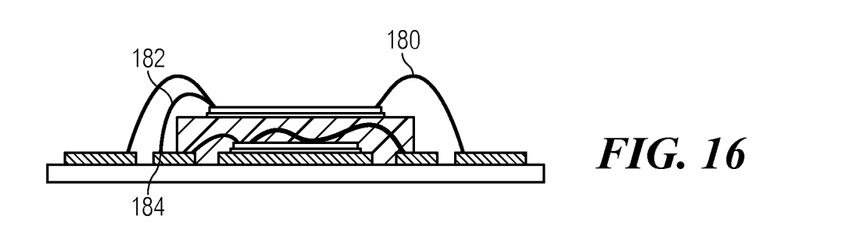
FIG. 16 is a cross-sectional view wire bonds attached to the second die to the lead frame of FIG. 15 in accordance with an embodiment of the invention.

FIG. 16 is a cross-sectional view wire bonds attached to the second die to the lead frame of FIG. 15 in accordance with an embodiment of the invention. The wire bonding process of wires 180,182 is similar to the wire bonding process of FIG. 7. The first wires 180 connect the second die 178 via die bond pads to leads of the lead frame 172. The second wires 182 interconnect the first die 158 with the second die 178 via the extruded lead portion 184 of the leads 152 of the lead frame of the first packaged semiconductor die 150.

Figure 17:
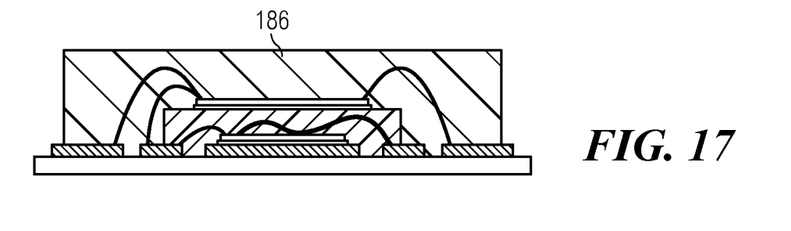
FIG. 17 is a cross-sectional view of mold material encapsulating the wire bonds, second die, lead frame, and first packaged semiconductor of FIG. 16 in accordance with an embodiment of the invention.
Figure 18:
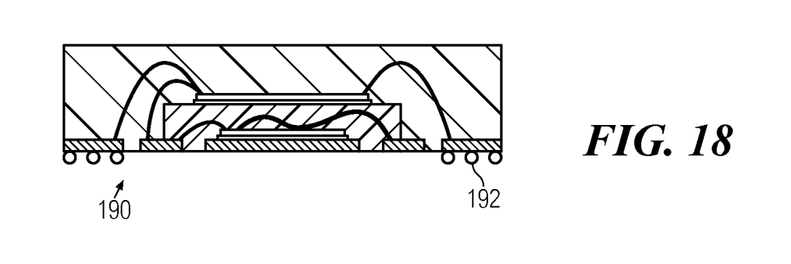
FIG. 18 shows a packaged semiconductor device with first packaged semiconductor interconnected and encapsulated with a second die with external connectors in a ball grid array (BGA) type packaged semiconductor device in accordance with an embodiment of the invention.
Figure 19:
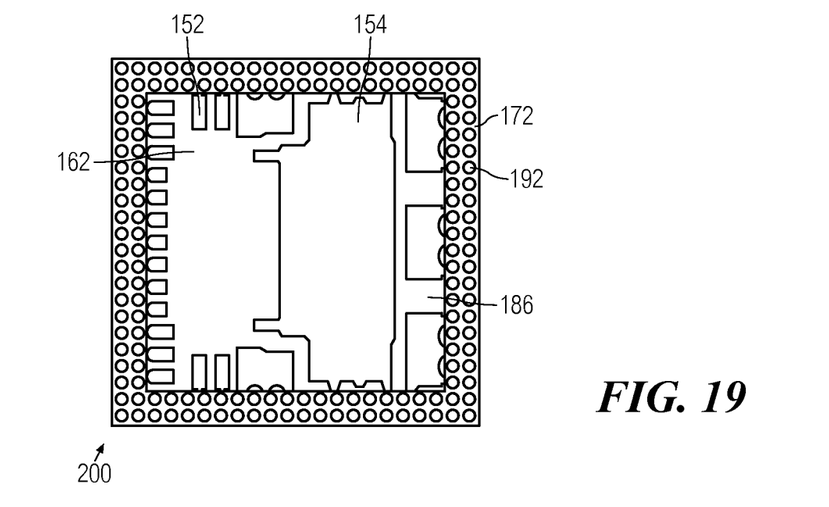
FIG. 19 shows a bottom plan view of the packaged semiconductor device of FIG. 18 in accordance with an embodiment of the invention.

FIG. 17 is a cross-sectional view of mold material 186 encapsulating the wire bonds 180,182, second die 178, lead frame 172, and first packaged semiconductor of FIG. 16 in accordance with an embodiment of the invention. The mold material 186 corresponds with the mold material 78 of FIG. 9. FIG. 18 shows a cross-sectional view of a packaged semiconductor device 190 with the tape 174 removed from the first packaged semiconductor 150 interconnected and encapsulated with a second die in accordance with an embodiment of the invention. Also shown are solder balls 192 forming the connectors for the packaged semiconductor 190. The solder balls 192 are attached or gang dipped to solder pads (not shown) on the bottom of the lead frame 172 after the tape 174 is removed. The pattern of the solder pads and solder balls may form a ball grid array of any number of patterns. FIG. 19 shows a bottom plan view 200 of the packaged semiconductor device of FIG. 18 in accordance with an embodiment of the invention where the ball grid array is shown along the perimeter of the packaged semiconductor 190. It will be appreciated that the pattern, pitch and size of the ball grid array may take different configurations and forms. The dimensions, shapes and patterns shown are just examples provided for illustrative purposes. This embodiment shown in FIGS. 13-19 is a packaged semiconductor of the ball grid array (BGA) type encapsulating a second die 178 stacked on a packaged PQFN. As the packaged semiconductor in an embodiment may have a die support or paddle, this embodiment utilizes the superior thermal conductivity of pure copper or other metal or metal alloy, and applies metal lead frame as die carrier and provides excellent thermal conductivity for high power devices. This embodiment also enables an aluminium wire which enables high current circuit with large wire section and parallel wire connections to enable high power devices.

Figure 20:
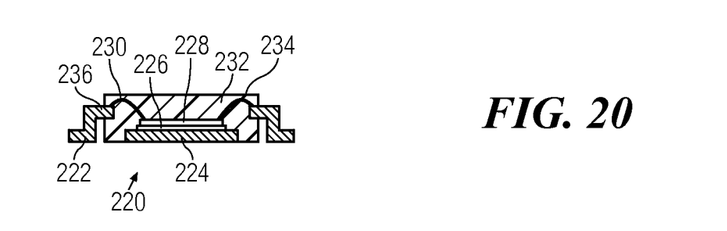
FIG. 20 is a cross-sectional view of a first packaged semiconductor device in accordance with an embodiment of the invention.
Figure 21:
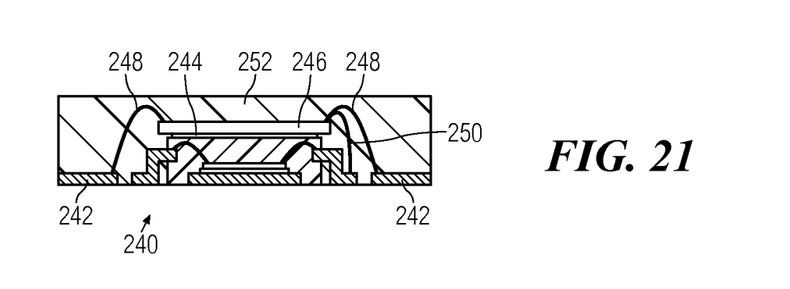
FIG. 21 shows a packaged semiconductor device with first packaged semiconductor shown in FIG. 20 interconnected and encapsulated with a second die in accordance with an embodiment of the invention.
Figure 22:
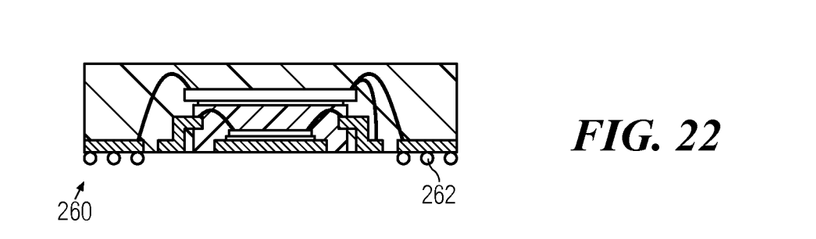
FIG. 22 shows a packaged semiconductor device of FIG. 21 with external connectors in a ball grid array (BGA) type packaged semiconductor device in accordance with an embodiment of the invention.

FIGS. 20-22 show different views of a semiconductor package with interconnected stacked die and packaged die have a BGA type semiconductor package in accordance with an embodiment of the invention. The different stages of packaging of this semiconductor package with interconnected stacked die and packaged die corresponds with the embodiments discussed with reference to FIGS. 1-19 and therefore, only the views of the semiconductor package of FIGS. 20-22 are shown.

FIG. 20 shows a cross-sectional area view of a packaged semiconductor device 220 with lead frame 222, a die pad 224, a die attach layer 226, a first die 228, wires 230, and encapsulant material 232 that forms the top side or surface 234 of the first packaged semiconductor 220. The lead frame 222 has a portion 236 that is in the same plane as the die pad area 224 and another portion that is in a different plane that wires 230 attach to from the wire pads (not shown) on top of the first die 228.

FIG. 21 shows the cross-sectional area view of a packaged semiconductor device 240 with first packaged semiconductor 220 of FIG. 20 interconnected and encapsulated with a second die in accordance with an embodiment of the invention. The packaged semiconductor device 240 comprises a second lead frame 242, a die attach layer 244, a second die 246, wires 248 connecting the second die to the lead of the lead frame 242 to external circuitry, wires 250 connecting the second die 246 to lead 222 of first die 228 and interconnect the second die 246 with the first die 228, and encapsulant material 252 to protect the components of the packaged semiconductor device 240. The processing steps in forming packaged semiconductor device 220 correspond with the processing steps shown in FIG. 1 to FIG. 12 with respect to packaged semiconductor device 90 and processing steps shown in FIG. 13-19 with respect to packaged semiconductor device 190. FIG. 22 shows the cross-sectional view of a packaged semiconductor device 260 with interconnects such as solder balls 262 to interconnect with external circuitry forming a BGA type packaged semiconductor device. FIG. 22 shows the cross-sectional view of a packaged semiconductor device 260 forming a package type of QFP embedded in a BGA type package 260.

Figure 23:
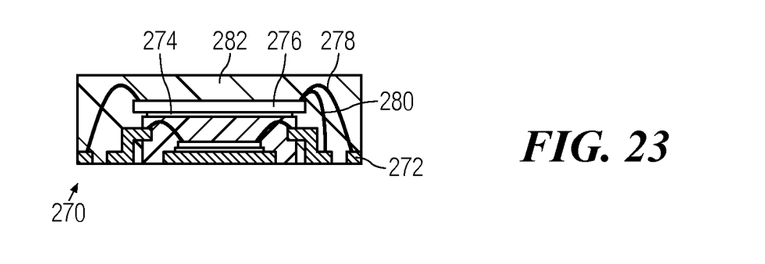
FIG. 23 shows cross-sectional view of a packaged semiconductor device with first packaged semiconductor shown in FIG. 20 interconnected and encapsulated with a second die in accordance with an embodiment of the invention.

FIG. 23 shows cross-sectional view of a packaged semiconductor device 270 with first packaged semiconductor 220 shown in FIG. 20 interconnected and encapsulated with a second die in accordance with an embodiment of the invention. The packaged semiconductor device 270 comprises a second lead frame 272, a die attach layer 274, a second die 276, wires 278 connecting the second die to the lead of the lead frame 272, wires 280 connecting the second die 276 with the first die 228, and encapsulant material 282 to protect the components of the packaged semiconductor device 270. The processing steps in forming packaged semiconductor device 270 correspond with the processing steps shown in FIGS. 1-12 with respect to packaged semiconductor device 80, 90 and processing steps shown in FIGS. 13-19 with respect to packaged semiconductor device 190, 200. FIG. 23 shows the cross-sectional view of a packaged semiconductor device 270 forming a package type of QFP embedded in a QFN type package 270.

Figure 24:
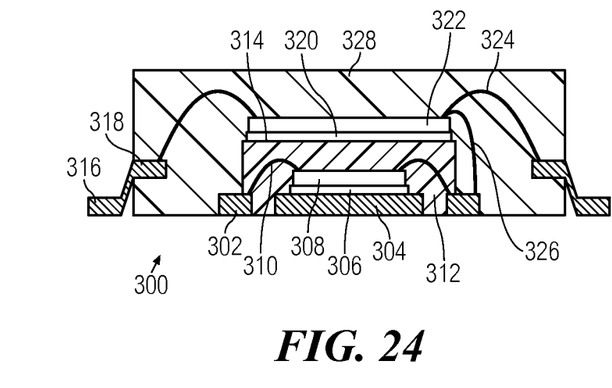
FIG. 24 is a cross-sectional view showing a packaged semiconductor device with first packaged semiconductor interconnected and encapsulated with a second die with exposed connectors in a quad flat no-lead (QFN) type packaged semiconductor device in accordance with an embodiment of the invention.
Figure 25:
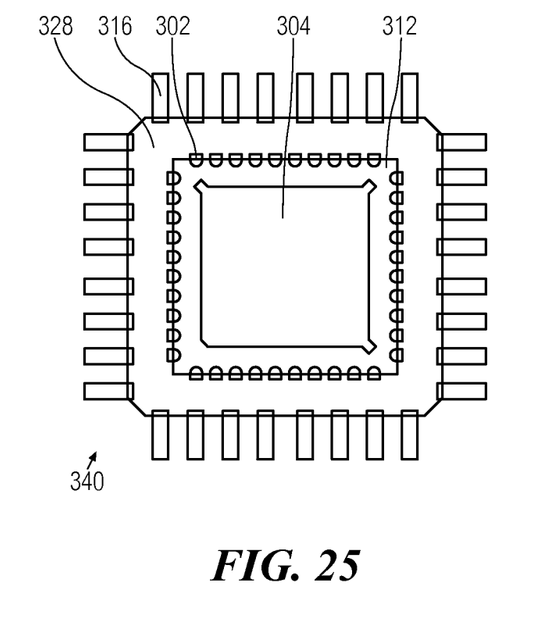
FIG. 25 shows a bottom plan view of the packaged semiconductor device of FIG. 24 in accordance with an embodiment of the invention.

FIGS. 24 and 25 show different views of a semiconductor package 300 with interconnected stacked die and packaged die in accordance with an embodiment of the invention. The different stages of packaging of this semiconductor package with interconnected stacked die and packaged die corresponds with the embodiments discussed with reference to FIGS. 1-19 and therefore, only the views of the semiconductor package of FIGS. 24 and 25 are shown. More particularly, the processing steps in forming the packaged semiconductor device 300 correspond with the processing steps shown in FIG. 1 to FIG. 12 with respect to packaged semiconductor device 80, 90 and processing steps shown in FIGS. 13-19 with respect to packaged semiconductor device 190, 200. The packaged first die comprises a first lead frame 302 with extruded leads, a die pad area 304 of the first lead frame, a die attach layer 306, a first die 308, wires 310 connecting the first die 308 from die pads (not shown) to the leads 302 of the lead frame, and encapsulant material 312 that forms the top side or surface 314 of the first die 308 and protects the components of the packaged first die. The semiconductor package device 300 further comprises a second lead frame 316 having a lead portion 318 on a different plane from the plane of the die pad area 304 of the first lead frame 302, die attach layer 320, second die 322, wires 324 to attach from wire bonds (not shown) from the surface of the second die 322 to the leads 324 of the second lead frame 316, wires 326 from wire bonds (not shown) from the surface of the second die 322 to the extruded leads 302 of the first lead frame, and encapsulant material 328 to protect the components of the packaged semiconductor device 300.

The second lead frame 316 with leads 318 at a different height or offset on a plane different from the other portion of the lead frame is shown and is applied together with the first packaged semiconductor die on a carrier such as tape (not shown). After processing the bond layer 320, bonding the second die 322, wire bonding wires 324 from the bond pad (not shown) from the second die 292 to the leads 318 of the lead frame 316, wires 326 from the bond pad (not shown) on the top of the second die to an extended lead 302 of the first lead frame, the components are molded with mold material. After molding, the tape is removed.

FIG. 25 shows a bottom plan view 340 of the packaged semiconductor device 300 of FIG. 24 in accordance with an embodiment of the invention. After removing the temporary carrier such as the tape, the bottom surfaces of the exposed surfaces of the leads of the first and second lead frames 302, 304, 316 and the bottom surface of the die support 304 or die pad area of the first lead frame.

It will be appreciated that other configurations are envisioned with different types of dies having different integrated circuits and devices, different types of first packaged semiconductor, and comprising different materials. The embodiments shown and discussed are provided as examples. Embodiments of the invention have been described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by the applicable law. Moreover, any combination of the above-described elements in all possible variations thereof is encompassed by the invention unless otherwise indicated herein or otherwise clearly contradicted by context.

While there has been described in the foregoing description embodiments of the invention, it will be understood by those skilled in the technology concerned that many variations or modifications in details of design or construction may be made without departing from the scope or purview of present invention as defined by the appended claims. The embodiments of the invention have been described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this description of the invention includes all modifications and equivalents of the subject matter recited in the claims appended hereto as permitted by the applicable law. Moreover, any combination of the above-described elements in all possible variations thereof is encompassed by the invention unless otherwise indicated herein or otherwise clearly contradicted by context.

What is claimed is:

1. A packaged semiconductor device, comprising:
   a first semiconductor die package having a first semiconductor die and a first lead frame covered with a first encapsulating material, and having exposed first leads, the first package having a first surface;
   a second semiconductor die affixed to the first surface of the first package;
   a second lead frame having second leads surrounding the first package for providing an input and output to the packaged semiconductor device to external circuitry with the first package and the second semiconductor die;
   a first connector to interconnect the first package with the second semiconductor die;
   a second connector to interconnect the second semiconductor die to the second lead frame; and
   a second encapsulating material that covers the first package, second semiconductor die, first connector, second connector, first lead frame and the second lead frame.

2. The packaged semiconductor device of claim 1, wherein a portion of the second lead frame is exposed.

3. The packaged semiconductor device of claim 1, wherein a portion of the first lead frame is exposed.

4. The packaged semiconductor device of claim 1, wherein a portion of the first lead frame is extruded from the first package.

5. The packaged semiconductor device of claim 1, wherein a portion of the second lead frame is offset on another plane from at least a portion of the lead frame.

6. The packaged semiconductor device of claim 5, wherein the offset portion of the second lead frame is the second leads of the second lead frame and wherein the offset portion is encapsulated by the second encapsulating material.

7. The packaged semiconductor device of claim 1, wherein the first packaged semiconductor die is a quad flat no-lead (QFN) type packaged device.

8. The packaged semiconductor device of claim 1, wherein the first package is a power quad flat no-lead (PQFN) type packaged device.

9. The packaged semiconductor device of claim 1, wherein the packaged semiconductor device is a quad flat no-lead (QFN) type packaged device.

10. The packaged semiconductor device of claim 1, wherein the packaged semiconductor device is a ball grid array (BGA) type packaged device.

* * * * *